United States Patent
Hagen et al.

(10) Patent No.: US 7,508,083 B2
(45) Date of Patent: Mar. 24, 2009

(54) ELECTRONIC COMPONENT COMPRISING A SEMICONDUCTOR CHIP AND A PLASTIC HOUSING, AND METHOD FOR PRODUCING THE SAME

(75) Inventors: Robert-Christian Hagen, Sarching (DE); Simon Jerebic, Regensburg (DE)

(73) Assignee: Infineon Technologies AG, Munich (DE)

( * ) Notice: Subject to any disclaimer, the term of this patent is extended or adjusted under 35 U.S.C. 154(b) by 282 days.

(21) Appl. No.: 10/548,854

(22) PCT Filed: Mar. 9, 2004

(86) PCT No.: PCT/DE2004/000461

§ 371 (c)(1),
(2), (4) Date: Jul. 11, 2006

(87) PCT Pub. No.: WO2004/082018

PCT Pub. Date: Sep. 23, 2004

(65) Prior Publication Data

US 2006/0255478 A1  Nov. 16, 2006

(30) Foreign Application Priority Data

Mar. 11, 2003 (DE) .................. 103 10 842

(51) Int. Cl.
*H01L 23/28* (2006.01)
*H01L 21/00* (2006.01)

(52) U.S. Cl. ............... 257/787; 257/620; 257/E23.131; 257/E21.502; 438/126; 438/460

(58) Field of Classification Search ................. 257/618, 257/620, 787, E23.123, E23.131, E23.133, 257/E21.502; 438/125–127, 460, 462
See application file for complete search history.

(56) References Cited

U.S. PATENT DOCUMENTS

| 5,742,098 | A | 4/1998 | Brunner |
| 6,184,064 | B1 | 2/2001 | Jiang et al. |
| 2002/0113131 | A1 | 8/2002 | Puschner et al. |
| 2002/0167078 | A1 | 11/2002 | Winderl et al. |
| 2004/0121618 | A1* | 6/2004 | Moore ........................ 438/782 |

FOREIGN PATENT DOCUMENTS

| DE | 44 01 588 | 7/1995 |
| DE | 102 06661 | 9/2002 |
| JP | 63143851 | 6/1988 |
| JP | 02144946 | 6/1990 |
| JP | 05063112 | 3/1993 |

* cited by examiner

*Primary Examiner*—Tuan N. Quach
(74) *Attorney, Agent, or Firm*—Dicke, Billig, Czaja PLLC

(57) ABSTRACT

The invention relates to an electronic component, which comprises a semiconductor chip. The semiconductor chip is embedded in a plastic housing in such a way that is rear side and its lateral sides are embedded in a plastic molding compound. The lateral sides and/or the rear side of the semiconductor chip have an anchoring region, by means of which the semiconductor chip is in positive engagement with the surrounding plastic molding compound. The invention also relates to a method for producing the component.

25 Claims, 2 Drawing Sheets

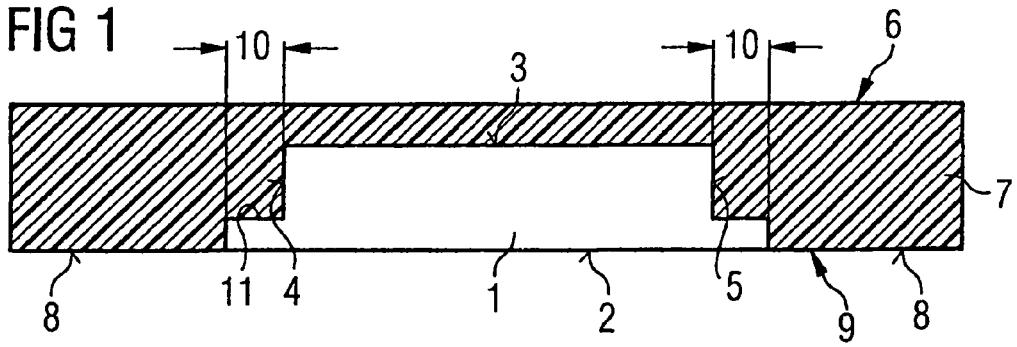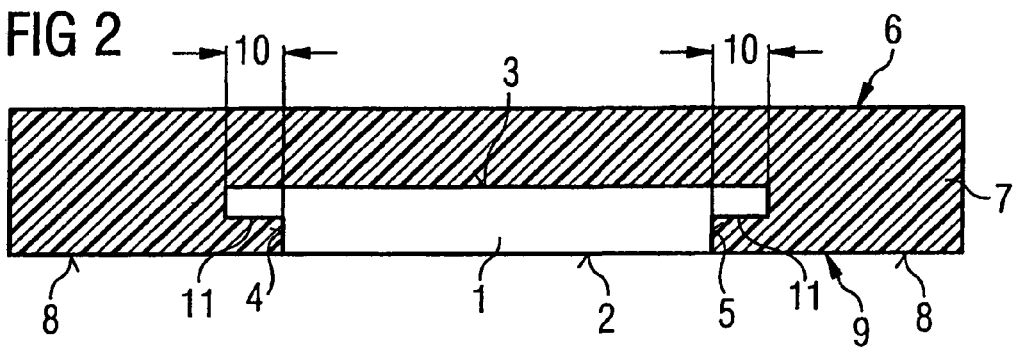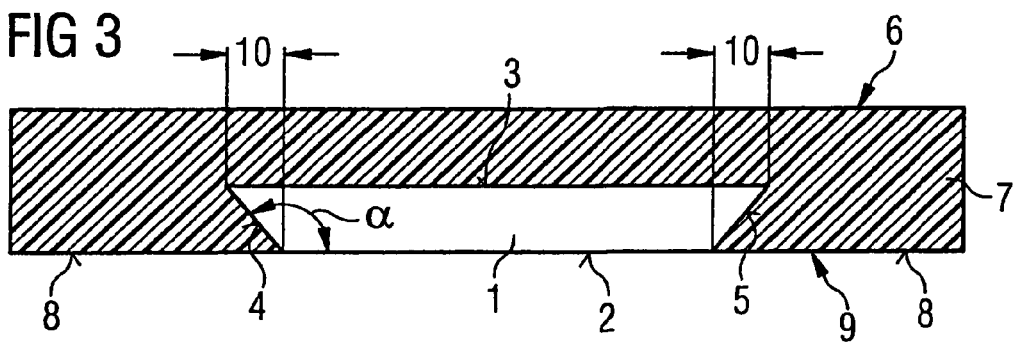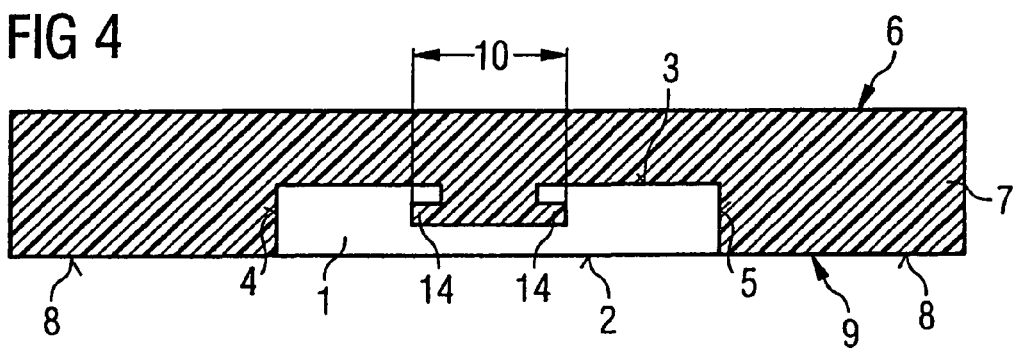

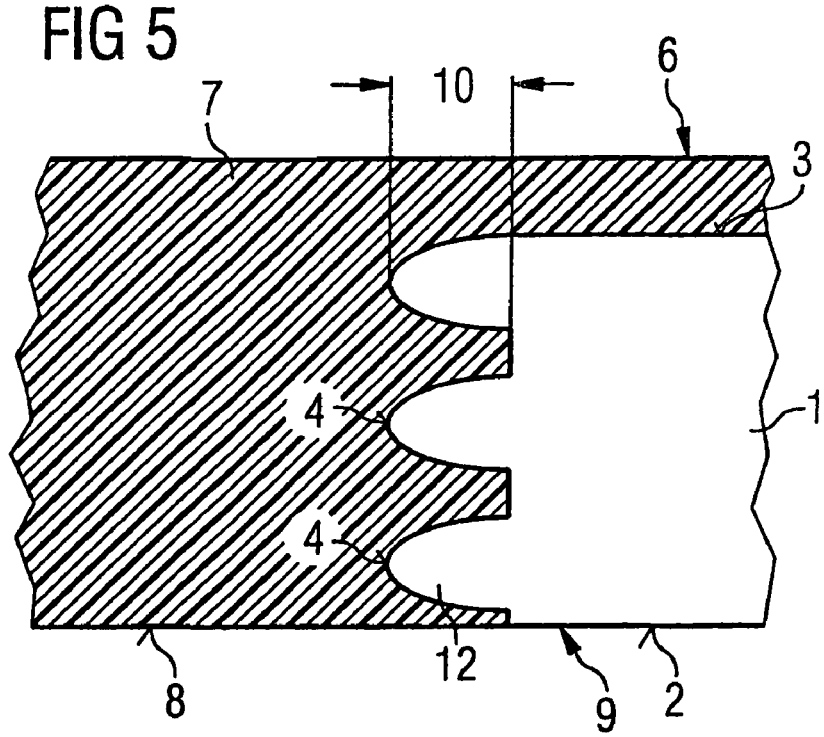
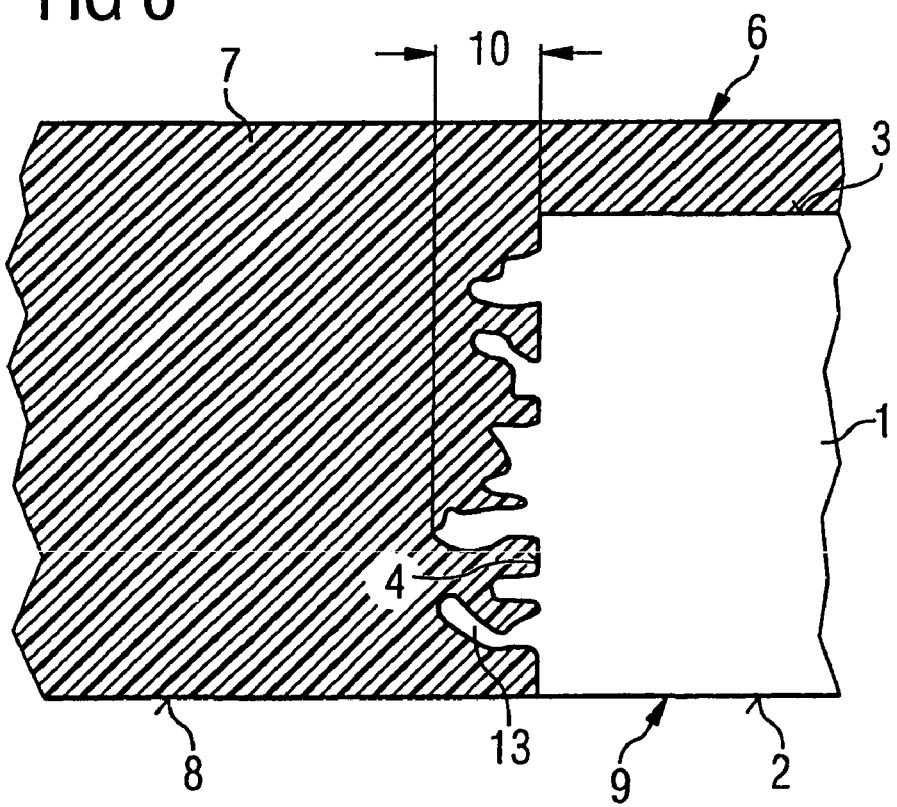

ELECTRONIC COMPONENT COMPRISING A SEMICONDUCTOR CHIP AND A PLASTIC HOUSING, AND METHOD FOR PRODUCING THE SAME

FIELD OF THE INVENTION

The invention relates to an electronic component, which has a semiconductor chip with an upper side, with a rear side and with lateral sides and also a plastic housing. In this case, the semiconductor chip is embedded in the plastic housing in such a way that the rear side and the lateral sides of the semiconductor chip are surrounded by a plastic molding compound, while the upper side of the semiconductor chip remains free from plastic molding compound. In addition, the invention relates to a method for producing the electronic component.

BACKGROUND

In the case of electronic components which are based on not having a chip island on which the semiconductor chip is fixed but in which the semiconductor chip is held only by the surrounding plastic molding compound of the housing, there is the risk of increased microcrack formation, ultimately resulting in delamination of the semiconductor chip. This risk becomes greater if, in addition, the upper side of the semiconductor chip is to be kept free from plastic molding compound, and consequently the semiconductor chip is not surrounded by plastic molding compound on all sides.

SUMMARY

The present invention provides a reliable electronic component which has a semiconductor chip which is surrounded by a plastic molding compound completely on its rear side and its lateral sides.

According to one embodiment of the invention, an electronic component which includes a semiconductor chip is provided. The semiconductor chip has, for its part, an upper side, a rear side and lateral sides. The semiconductor chip is integrated in a plastic housing and is thereby surrounded by a plastic molding compound on a rear side and the lateral sides. The upper side of the semiconductor chip may then remain partly or entirely free from plastic molding compound and form a planar surface with the upper side of the plastic housing. In this case, the lateral sides and/or the rear side of the semiconductor chip have at least one anchoring region, by means of which the semiconductor chip is in positive engagement with the surrounding plastic molding compound.

In one embodiment a component of this type has the advantage that, on account of the positive connection between the semiconductor chip and the plastic molding compound, microcrack formation and propagation of microcracks in the plastic molding compound are reduced, which increases reliability. At the same time, propagation of microcracks in the direction of the surface of the plastic housing can be reduced by shaping of the anchoring region.

In a first embodiment of the invention, the lateral sides of the semiconductor chip have a profile which forms an obtuse angle in relation to the upper side of the semiconductor chip. This obtuse angle of the lateral sides achieves the effect that, with increasing thickness, the plastic molding compound is gradually flared over the lateral sides of the semiconductor chip toward the upper side of the plastic housing. Apart from the positive connection between the semiconductor chip and the plastic molding compound, at the same time the effect is achieved that the semiconductor chip does not form a sharp right-angled edge in the region of its upper side toward the lateral sides, but rather, with the aid of the obtuse angle, creates a smooth transition.

Furthermore, the lateral sides may have a step. This step may on the one hand lie deep within the volume of the plastic housing or be arranged on the upper side of the semiconductor chip. An arrangement of the step of the lateral sides, anchoring the semiconductor chip, in the depth of the plastic molding compound has the advantage that microcracks caused by thermal stresses occur in the depth of the plastic housing and not in the vicinity of the upper side of the plastic housing.

If the step is arranged in the region of the upper side of the semiconductor chip, so that the step surrounds the semiconductor chip like the rim of a dish, this has the advantage that microcracks which occur in the volume of the plastic molding compound at the bottom of the dish-shaped semiconductor chip cannot penetrate through the lateral region of the semiconductor chip, which is characterized by the step, to the upper side of the electronic component. Rather, the step-shaped side of the semiconductor chip stops them from also producing microcracks on the upper side of the plastic housing.

In one embodiment, the lateral sides may be formed in such a way that they have indentations, with which they are interlocked with the plastic molding compound. On account of their roundings, these indentations are suitable for not allowing any microcracks to be produced in the plastic material. Furthermore, the rounding that comes closest to the surface may be formed in such a way that, with increasing thickness, the plastic molding compound approximates to the level of the upper side of the semiconductor chip.

A further embodiment apart from the structuring of the profile of the lateral sides is to achieve intensive anchoring between the semiconductor material and the plastic molding compound by applying dendrites to the upper sides of the semiconductor chip that are to be embedded. Dendrites not only prevent propagation of microcracks in the plastic molding compound, but also form an intensive interlocking between the semiconductor chip and the plastic molding compound. In addition, the dendrites may comprise a material that is different from the semiconductor chip, such as an oxide ceramic or a metal. Furthermore, the dendrites may additionally be provided on differently pre-profiled anchoring regions of a semiconductor chip.

A further embodiment for anchorage is to provide the rear side of the semiconductor chip with undercuts which form a positive connection between the plastic molding compound and the semiconductor chip material. Undercuts of this type may be introduced on the rear side of the semiconductor chips in the form of dovetail structures or other step-shaped notches by high-speed milling cutters or by corresponding laser ablation or by undercuttings in an etching process.

In one embodiment, a method for producing a semiconductor chip with anchoring regions for a plastic molding compound surrounding the semiconductor chip has the following process.

A semiconductor wafer which has integrated circuits arranged in rows and columns in a number of semiconductor chip positions is prepared. This semiconductor wafer is subsequently divided into semiconductor chips by means of a profile saw and/or by means of laser ablation, while profiling the lateral sides and/or the rear side of the semiconductor chip. After dividing up the semiconductor wafer into semiconductor chips with profiled lateral sides and/or profiled rear sides, a semiconductor chip is embedded in a plastic molding compound, while leaving the upper side of the semiconductor chip free. In this embodiment, the upper side of the semiconductor chip and the upper side of the plastic molding compound form a common, planar surface.

This method has the advantage that a number of semiconductor chips can be provided with anchoring regions at the same time in the process of dividing semiconductor chips from a semiconductor wafer. It is subsequently possible to introduce these profiled semiconductor chips into the plastic molding compound built up in the form of a sheet, so as to produce a panel which can then be further processed with firmly anchored semiconductor chips in the plastic sheet.

In the profile sawing, the aforementioned step-shaped lateral sides or an obtuse angle of the lateral sides in relation to the upper side can be formed. In order to introduce undercuts into the rear side, it is advisable to provide the rear side of the semiconductor wafer before the dividing-up operation with appropriate milling tracks which have undercuts. If dividing takes place by laser ablation, the rear side of the semiconductor chip may also be profiled in the prescribed way as described above at the same time as the formation of the dividing gaps.

Both profiled semiconductor chips and unprofiled semiconductor chips may be immersed in a chemical or electrolytic bath before the embedding of the semiconductor chip in a plastic molding compound, dendrites of oxide ceramics or of metal being deposited on the lateral sides and/or on the rear side of the semiconductor chip. These finely structured dendrites not only improve the capability of forming a positive connection but also reduce the risk of microcracks in the region of the transition from the semiconductor chip to the plastic molding compound.

The often inadequate adhesion to one another of the individual constituent parts of an electronic component, such as the semiconductor chip, the chip adhesive and the molding compound, together with environmental influences such as thermal cycles, bring about what is known as delamination and cracks. In principle, delaminations and microcracks represent a deficiency in quality and, depending on the degree to which they occur and environmental conditions, may induce chip ruptures and/or ruptures of the bonding connections, and consequently lead to the electrical failure of the semiconductor component.

This risk is particularly great in the case of chips molded on one side, since they may have cracks along the chip edges when there are changes in temperature as a result of stresses caused by different coefficients of thermal expansion of the housing, for example between the housing and the terminal board. These cracks along the chip edges may lead to detachments of interconnects of the thin-film redistribution routings applied to the common surface of the semiconductor housing and the semiconductor chip. In this case, these cracks and/or delaminations propagate in particular along straight edges. This is further encouraged by the cuboidal shape of semiconductor chips. This cuboidal shape and the smooth surfaces of these cuboids are caused by the production processes. In this case, the four lateral outer surfaces are created by the process of chip singulation. For process-engineering reasons, these surfaces are planar and orthogonal to one another, which is conducive to the propagation of microcracks.

The roughness occurring in the production process, both macroscopic and microscopic, is not sufficient to ensure reliable anchorage of the semiconductor chip in the plastic molding compound for loads occurring. The enlargement of the interface between the semiconductor chip and the plastic molding compound provided by the invention has the effect of lowering the risk of the occurrence and propagation of delaminations and microcracks between these two materials.

The propagation along the otherwise straight lateral sides of the semiconductor chip is thereby hindered and, according to embodiments of the invention, the modification of the lateral sides and the rear side of the semiconductor chip allows not only improved chemical interfacial adhesion to be achieved but also a positive mechanical connection by means of undercuts.

Consequently, the measures according to embodiments of the invention allow cracks to be completely suppressed or cracks that occur to be made to propagate more slowly, or the cracks are prevented from propagating from the chip surface and plastic housing as far as the common upper side by means of a step or bevel.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a cross section through a detail of an electronic component of a first embodiment of the invention.

FIG. 2 illustrates a cross section through a detail of an electronic component of a second embodiment of the invention.

FIG. 3 illustrates a cross section through a detail of an electronic component of a third embodiment of the invention.

FIG. 4 illustrates a cross section through a detail of an electronic component of a fourth embodiment of the invention.

FIG. 5 illustrates a cross section through a detail in the lateral region of the semiconductor chip of an electronic component of a fourth embodiment of the invention.

FIG. 6 illustrates a cross section through a detail in the region of the lateral side of the semiconductor chip of an electronic component of a sixth embodiment of the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 illustrates a cross section through a detail of an electronic component of a first embodiment of the invention. The electronic component has a plastic housing 6 with a plastic molding compound 7, which completely surrounds the semiconductor chip 1 on its rear side 3 and on its lateral sides 4 and 5. The upper side 2 of the semiconductor chip 1 is kept free from the plastic molding compound 7 and forms a common planar surface 9 with the upper side 8 of the plastic housing 6.

Thin-film structures, such as interconnects and other wiring components, may be applied on the common planar surface 9, in order for example to connect contact areas (not shown here), which are arranged on the upper side 2 of the semiconductor chip 1, to corresponding outer contacts (not shown here) on the upper side of the plastic housing. The lateral sides 4 and 5 of this first embodiment of the invention have a step 11 in an anchoring region 10. This step 11 interrupts the smooth lateral sides 4 and 5, so that microcracks which are produced in the depth of the plastic molding compound 7 or run from the outer component surfaces in the direction of the chip are hindered from also propagating as far as the common surface 9 by the lateral sides 4 and 5 taking the form of the rim of a dish. In order to achieve this protective effect, the thickness of the step 11 is much less than the overall thickness of the semiconductor chip. In this embodiment of the invention, the step 11 has a thickness of about 20 to 300 µm, while the thickness of the entire semiconductor chip 1 lies between 50 and 750 µm. Other absolute sizes may also be used if approximately the same proportions are maintained. In one embodiment, the ratio between the thickness of the step and the chip thickness may be approximately 0.1 to 0.3-0.4 or even up to about 0.8.

FIG. 2 illustrates a cross section through a detail of an electronic component according to a second embodiment of the invention. Components with the same functions as in FIG. 1 are identified by the same designations and are not separately explained. The embodiment according to FIG. 2 differs from the embodiment that is illustrated in FIG. 1 in that the step 11 on the lateral sides 4 and 5 of the semiconductor chip is not arranged on the upper side 2 of the semiconductor chip, but on the rear side 3. With this arrangement, a secure positive connection is achieved and at the same time it is ensured that microcracks are produced substantially in the region of the rear side 3, that is to say within the plastic molding compound 7 at the step arranged there, and propagate horizontally and less in the direction of the upper side 8 of the plastic housing.

FIG. 3 illustrates a cross section through a detail of an electronic component according to a third embodiment of the invention. Components with the same functions as in the previous figures are identified by the same designations and are not explained separately. As a difference from the previous two figures, in FIG. 3 there is illustrated an embodiment of the invention in which the lateral sides 4 and 5 of the semiconductor chip 1 are aligned at an obtuse angle α in relation to the surface 2 of the semiconductor chip 1. Such a profile of the lateral sides 4 and 5 achieves the effect that, with increasing thickness, the plastic molding compound 7 is flared in the direction of the upper side 2 of the semiconductor chip 1. Furthermore, microcracks tend to propagate at the acute angle between the rear side 3 and lateral sides 4 and 5 of the semiconductor chip 1 in the depth of the plastic molding compound 7, but not in the vicinity of the upper side 8 of the plastic housing 6.

FIG. 4 illustrates a cross section through a detail of an electronic component according to a fourth embodiment of the invention. In the case of this embodiment of the invention, the lateral sides 4 and 5 have been left smooth, but an anchoring region 10, which has undercuts 14, is arranged on the rear side 3 of the semiconductor chip. Microcracks which are produced in this anchoring region 10, arranged on the rear side 3 of the semiconductor chip 1, cannot propagate in the direction of the common surface 9. Such a positive anchorage 10 of a semiconductor chip 1 in a plastic molding compound 7 can be intensified if the lateral edges 4 and 5 have microscopically small structures in the form of dendrites or indentations, as FIGS. 5 and 6 illustrate.

FIG. 5 illustrates a cross section through a detail in the region of the lateral side of the semiconductor chip 1 of a component of a fourth embodiment of the invention. Indentations 12 are arranged in the lateral region. These curved formations 12 are rounded, so that microcracks can extend along them.

FIG. 6 illustrates a cross section of a detail in the lateral region of the semiconductor chip 1 of a component of a sixth embodiment of the invention. In this case, the lateral side 4 is provided with dendrites 13, which have for example been deposited on the lateral side 4 in an electrolytic bath. Such dendrites 13 provide an intensive positive connection between the semiconductor chip 1 and the plastic molding compound 7 and may also be applied on the rear side 3 (not shown here) of the semiconductor chip 1. These dendrites have been deposited on the lateral side 4 in an electrolytic bath and comprise oxide ceramics.

It is equally conceivable also to remove surface regions in a specific manner in order to create a similarly roughened lateral side.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An electronic component comprising:
a plastic housing made of a plastic molding compound;
a semiconductor chip having an upper side, a rear side and lateral sides, the semiconductor chip being embedded in the plastic housing configured such that the rear side and the lateral sides of the semiconductor chip are fully surrounded by the plastic molding compound and such that the upper side is exposed from the plastic molding compound, the lateral sides and the rear side of the semiconductor chip having at least one anchoring region, by means of which the semiconductor chip is in positive engagement with the surrounding plastic molding compound.

2. The electronic component of claim 1, comprising:
wherein the lateral sides comprise a profile which is inclined in relation to the upper side at an obtuse angle.

3. The electronic component of claim 1, comprising:
wherein the lateral sides comprise a step.

4. The electronic component of claim 1, comprising:
wherein the lateral sides comprise indentations.

5. An electronic component comprising:
a plastic housing made of a plastic molding compound;
a semiconductor chip having an upper side, a rear side and lateral sides, the semiconductor chip being embedded in the plastic housing configured such that the rear side and the lateral sides of the semiconductor chip are fully surrounded by the plastic molding compound and such that the upper side is exposed from the plastic molding compound, the lateral sides and/or the rear side of the semiconductor chip having at least one anchoring region, by means of which the semiconductor chip is in positive engagement with the surrounding plastic molding compound, wherein the lateral sides and the rear side comprise dendrites.

6. The electronic component of claim 5, comprising:
wherein the lateral sides and the rear sides comprise dendrites.

7. The electronic component of claim 5, comprising:
wherein the dendrites are electrolytically applied dendrites.

8. The electronic component of claim 5, comprising:
wherein the dendrites are chemically applied dendrites.

9. An electronic component comprising:
a plastic housing made of a plastic molding compound;
a semiconductor chip having an upper side, a rear side and lateral sides, the semiconductor chip being embedded in the plastic housing configured such that the rear side and the lateral sides of the semiconductor chip are surrounded by the plastic molding compound, the rear side of the semiconductor chip having at least one anchoring region, by means of which the semiconductor chip is in positive engagement with the surrounding plastic molding compound, wherein the rear side of the semiconductor chip comprises an undercut anchoring the semiconductor chip in the plastic molding compound.

10. The electronic component of claim 9, comprising:
wherein the undercut anchoring is an etched undercutting.

11. An electronic component comprising:
a plastic housing made of a plastic molding compound;
a semiconductor chip having an upper side, a rear side and lateral sides, the semiconductor chip being embedded in the plastic housing configured such that only the rear side and the lateral sides of the semiconductor chip are surrounded by the plastic molding compound, the lateral sides and the rear side of the semiconductor chip having at least one anchoring region configured to positively engage the semiconductor chip with the surrounding plastic molding compound.

12. The electronic component of claim 11, comprising:
wherein anchoring region comprises the lateral sides having a profile which is inclined relative to a planar surface defined by the upper side at an obtuse angle.

13. The electronic component of claim 11, comprising:
wherein the anchoring region comprises the lateral sides having a step.

14. The electronic component of claim 13, comprising:
wherein the step is adjacent the upper side.

15. The electronic component of claim 13, comprising:
wherein the step is adjacent the rear side.

16. The electronic component of claim 11, comprising:
wherein anchoring region comprises the lateral sides having indentations.

17. The electronic component of claim 11, comprising:
wherein the anchoring region comprises the lateral sides having dendrites.

18. The electronic component of claim 11, comprising:
wherein the anchoring region comprises the rear side having an under cut containing plastic molding compound of the housing.

19. The electronic component of claim 11, comprising:
wherein the anchoring region comprises the rear side having applied dendrites.

20. A method for producing a semiconductor chip comprising:
preparing a semiconductor wafer with integrated circuits arranged in rows and columns in semiconductor chip positions;
dividing the semiconductor wafer into semiconductor chips; by means of a profile saw and/or by means of laser ablation;
profiling rear and lateral sides of the semiconductor chip to form an anchoring region; and
embedding the semiconductor chip, including the anchoring region, in a plastic molding compound such that the rear and lateral sides are fully embedded in the plastic molding compound and an upper side of the semiconductor chip is kept free from the plastic molding compound and forms a common planar surface with an upper side of the plastic molding compound.

21. The method of claim 20, comprising:
profiling the side using a profile saw.

22. The method of claim 20, comprising
profiling the side using laser ablation.

23. The method of claim 20, comprising:
defining the side to be a lateral side.

24. The method of claim 20, comprising
defining the side to be a rear side.

25. The method of claim 20, comprising:
wherein prior to embedding of the semiconductor chip in a plastic molding compound, comprising:
immersing the semiconductor chip with its lateral sides and/or its rear side in a bath for the chemical or electrolytic deposition of dendrites on the lateral sides and/or on the rear side.

* * * * *